United States Patent [19]
Wilkes et al.

[11] 3,801,919
[45] Apr. 2, 1974

[54] NULL LOOP FOR CORRECTING LOW FREQUENCY ERROR SIGNALS IN HIGH PERFORMANCE AMPLIFIERS

[75] Inventors: Don Earl Wilkes, Houston; Charles L. Thompson, Stafford, both of Tex.

[73] Assignee: Mandrel Industries, Inc., Houston, Tex.

[22] Filed: Oct. 30, 1972

[21] Appl. No.: 294,450

[52] U.S. Cl. .......................... 330/9, 330/51, 330/85, 330/110, 330/149, 179/15 AN
[51] Int. Cl. .............................................. H03f 1/26
[58] Field of Search ........... 330/9, 51, 85, 110, 149; 328/162

[56] References Cited

UNITED STATES PATENTS 3,667,055 5/1972 Uchida ............................... 330/9 X

OTHER PUBLICATIONS

Korn and Korn, "Electronic Analog Computers," Second Edition, McGraw-HILL Book Company, New York, 1956, page 13.

*Primary Examiner*—Herman Karl Saalbach
*Assistant Examiner*—James B. Mullins
*Attorney, Agent, or Firm*—Arnold, White & Durkee

[57] ABSTRACT

A feedback null loop includes a low drift, first loop amplifier connected to the output of a fast settling, large drift amplifier means which is to be corrected for AC and DC errors due to stray signal coupling. A second loop amplifier with high impedance is coupled to the low drift first loop amplifier via electronic switch means. A ground line is provided to the input of the large drift amplifier means; e.g., via the conventional multiplexer apparatus in a multi-channel data acquisition system, whereby the output voltage of the amplifier means is nulled to zero. Prior to opening the switch means in the null loop, a capacitor stores a fixed voltage representing the error signal. Thereafter, as the multiplexer apparatus selects successive channels of the data acquisition system, any DC off-set levels are balanced out via the temporarily stored capacitor voltage.

5 Claims, 6 Drawing Figures

NULL LOOP FOR CORRECTING LOW FREQUENCY ERROR SIGNALS IN HIGH PERFORMANCE AMPLIFIERS

BACKGROUND OF THE INVENTION

1. Field

The invention relates to circuits for correcting DC and low frequency AC error signals in high performance amplifiers, and more particularly to a feedback null loop for correcting such errors.

2. Prior Art

Operational amplifiers which are selected for fast settling characteristics generally do not meet DC off-set and/or drift requirements, and also may experience DC and AC error signals at the amplifier input. In applications where a wideband, low noise amplifier is required, the DC off-set level is generally sacrificed to provide the desired fast settling characteristics, thereby requiring means for reducing DC off-set level errors.

SUMMARY OF THE INVENTION

The present invention overcomes various shortcomings of prior art circuits by providing a feedback null loop which balances out low frequency AC and DC off-set level errors in wideband, low noise, fast settling operational amplifiers. Briefly, the output of a fast settling channel amplifier used, for example, in a data acquisition system such as in the field of seismic exploration, to amplify the input data, is coupled to a low drift operational amplifier input. The latter amplifier is coupled via switch means to a second loop amplifier having a large input impedance. The conventional multiplexer of the seismic system includes a null channel which provides a grounded input to the channel amplifier. With the switch means closed to complete the null loop, the output voltage of the channel amplifier is nulled to zero. Prior to opening the switch means, a capacitor in parallel with the second loop amplifier stores a fixed voltage representing the error signal. Thereafter, as the multiplexer selects successive channels of input information, any error signal appearing at the channel amplifier output is balanced out via the fixed voltage stored in the capacitor. The input impedance of the second loop amplifier is large enough to hold the correction voltage on the capacitor until the next null determination is made.

DESCRIPTION OF THE PREFERRED EMBODIMENT

Although the invention null loop combination is herein particularly described with reference to correcting DC off-set and/or drift in operational amplifiers employed in a multi-channel geophysical exploration system, it is to be understood that the invention may be utilized for correcting DC and/or low frequency AC offset and drift error signals in any high performance amplifier.

Figure 1:
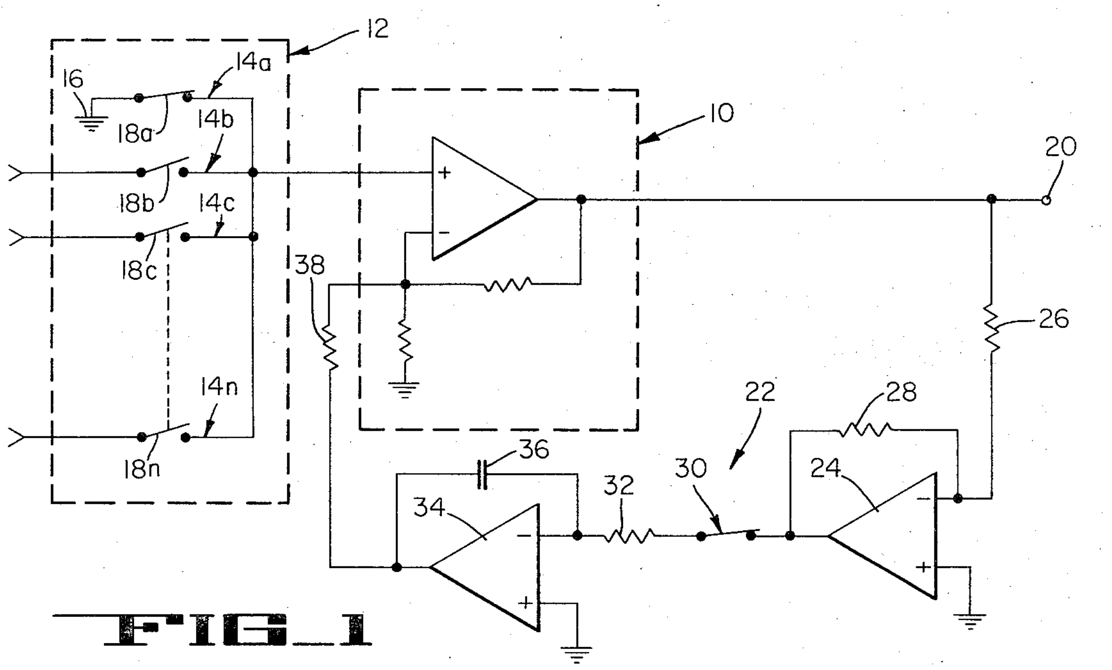
FIG. 1 is a schematic diagram of a circuit embodiment exemplifying the combination of the invention.

Accordingly, FIG. 1 depicts a channel operational amplifier 10 of wideband, fast settling characteristics, which inherently has excessive DC off-set level and drift. The amplifier is herein shown as part of a geophysical exploration system, wherein a generally conventional multiplexer means 12 includes a plurality of input data channels 14*a*–14*n* coupled to the input of the channel operational amplifier 10. However, the multiplexer means 12 is modified to include a null channel 14*a*, having a ground 16 which is selectively coupled to the amplifier 10 via a contact 18*a* of the multiplexer. Output terminal 20 provides a voltage $V_0$ which includes any error signals due to the characteristics of the wideband channel amplifier 10.

Further in accordance with the invention combination, a feedback null loop 22 is coupled from the output to the input of the channel amplifier 10. Loop 22 includes a chopper stabilized, low drift, operational amplifier 24, herein termed a first loop amplifier for convenience. A pair of resistors 26, 28 are coupled to, and across, the amplifier 24 respectively, to set the gain of this amplifier stage. The output of the first loop amplifier 24 is coupled via switch means 30 and coupling resistor 32 to a second loop operational amplifier 34, which has a large input impedance. Amplifier 34 includes the storage capacitor 36, to define in essence a sample-and-hold circuit of high impedance input, such that the capacitor 36 will not leak voltage after switch means 30 opens. The output of the second loop amplifier 34 is coupled via voltage divider resistor 38 to the input of the channel amplifier 10.

In operation, when the multiplexer means 12 selects the null channel 14a via switch contact 18a, the input to the channel amplifier 10 is grounded, and the feedback null loop 22 is completed by closing the switch means 30. Thus, the output voltage $V_0$ may be nulled to a zero value, whereby the closed null loop corrects for any error voltage at terminal 20 caused by DC and low frequency AC voltage offset or drift of the channel amplifier 10, or by multiplexer 12 error signals. The loop 22 is opened just prior to switching the multiplexer 12 from the null channel 14a to a first of the plurality of data channels, herein indicated by numerals 14*b*–14*n*. The error correction voltage provided during the null step is stored in the capacitor 36. The input impedance of the high impedance, second loop amplifier 34 should be large enough to hold this correction voltage until the null channel 14*a* is again switched into the amplifier 10 via the multiplexer 12.

It may be seen, that the DC voltage drift at output terminal 20 is approximately equal to; (input voltage drift of amplifier 34)× resistor 26/resistor 28 + (input voltage drift of amplifier 24). Thus, it may be seen that the DC voltage drift is not a function of the drift of the channel amplifier 10. The null loop accordingly acts as a high pass filter for signals which are common to all the multiplexer data channels. The filter cut-off frequency depends on the loop circuit time constant and the null channel duty cycle.

Figures 2A, 2B, 2C, 2D, 2E:
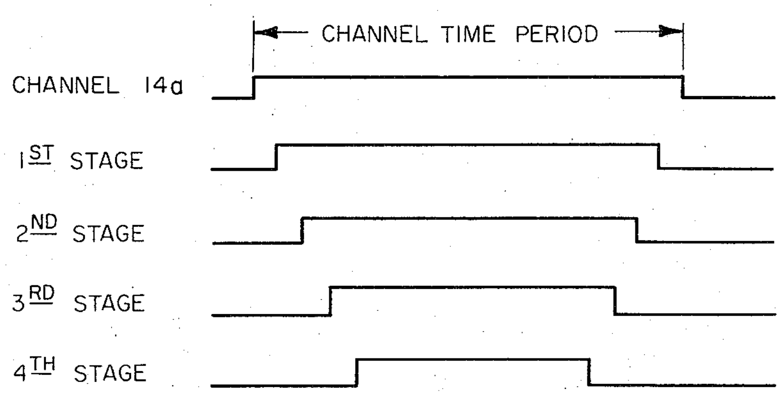
FIGS. 2A–2E are graphs showing the waveforms corresponding to the switching sequence performed via the multiplexer and a successive plurality of amplifier stages, each provided with the invention circuit.

Although a single stage amplifier 10 is shown here, a serial plurality of amplifier stages may be employed as typical in floating point amplifier apparatus in a seismic exploration system. In accordance with the invention, each of the stages (not shown) is nulled as described above, but in sequential fashion. To this end, as depicted in FIG. 2, successive amplifier stages similar to channel amplifier 10 are turned on and off in sequence during the null process which extends over a channel time period of, for example, 31 microseconds. Accordingly, the multiplexer switch contacts 18*a* are closed to couple the null channel 14a and thus ground 16 to the amplifier stages. Thereafter, the switch means (30) of each stage is successively turned on a few microseconds after the switch means (30) of the previous stage, and each is turned off prior to the switch means of the previous stage, as depicted in FIGS. 2B–2E. Thus sequentially switching in successive null loops (22) allows the previous null point (output terminal 20) to return to zero prior to nulling the succeeding output terminal of the next amplifier stage. After all the stages are nulled, the multiplexer 12 switches from the null channel 14a to the successive data channels 14*b*–14*n*. The error correction voltages of each capacitor (36) of successive stages corrects for the respective off-set of each stage during the taking of the channels of data, as previously described with respect to the operation of the single stage 10 of FIG. 1.

The operational amplifiers 10, 24, 34 per se are conventional in the art. The values of resistors 26, 28 are selected depending upon the feedback loop gain, speed, etc.

We claim:

1. An amplifier null loop for reducing DC and low frequency AC offset and drift in wideband, fast settling, high performance operational amplifiers with high drift characteristics, comprising the combination of:

means for selectively grounding the input of the wideband, fast settling, high performance operational amplifier; and a feedback loop including:

a low drift, chopper-stabilized, operational amplifier;

a high input impedance operational amplifier;

a storage capacitor coupled across the high input impedance amplifier for storing a fixed voltage representing the output of the high performance amplifier when the input thereto is grounded; and a switch for selectively coupling the feedback loop from the output to the input of the high performance amplifier.

2. The amplifier null loop of claim 1, wherein the low drift operational amplifier is coupled to the output of the high performance amplifier, the switch is coupled to the output of the low drift operational amplifier, and the high input impedance operational amplifier is coupled between said switch and the input to said high performance amplifier.

3. The amplifier null loop of claim 1, wherein the means for selectively grounding the input of the high performance amplifier includes a multiplexer for periodically connecting each of a set of successive input data channels to said input and at least one of the input data channels of said set represents ground.

4. The amplifier null loop of claim 3, wherein the first input data channel of said set represents ground and said set comprises at least four input data channels.

5. The amplifier null loop of claim 3, wherein the input impedance of the high input impedance amplifier is sufficient to hold the fixed voltage on the storage capacitor for the time between successive groundings of the input of the high performance amplifier.

* * * * *

PO-1050
(5/69)

UNITED STATES PATENT OFFICE
CERTIFICATE OF CORRECTION

Patent No. 3,801,919 Dated April 2, 1974

Inventor(s) Don Earl Wilkes and Charles L. Thompson

It is certified that error appears in the above-identified patent and that said Letters Patent are hereby corrected as shown below:

In the identification of the assignee, "Mandrel Industries, Inc." is corrected to read --Petty-Ray Geophysical, Inc.--.

Signed and sealed this 8th day of October 1974.

(SEAL)
Attest:

McCOY M. GIBSON JR.
Attesting Officer

C. MARSHALL DANN
Commissioner of Patents